(12) United States Patent
Djokovic et al.

(10) Patent No.: US 6,622,282 B2
(45) Date of Patent: Sep. 16, 2003

(54) TRELLIS CODING WITH ONE-BIT CONSTELLATIONS

(75) Inventors: Igor Djokovic, Irvine, CA (US); Chris Pagnanelli, Huntington Beach, CA (US)

(73) Assignee: Globespan, Inc., Red Bank, NJ (US)

( * ) Notice: Subject to any disclaimer, the term of this patent is extended or adjusted under 35 U.S.C. 154(b) by 447 days.

(21) Appl. No.: 09/759,694

(22) Filed: Jan. 12, 2001

(65) Prior Publication Data

US 2001/0042235 A1 Nov. 15, 2001

Related U.S. Application Data

(60) Provisional application No. 60/176,130, filed on Jan. 14, 2000.

(51) Int. Cl.[7] .......................... H03M 13/03; H04L 23/02
(52) U.S. Cl. ......................................... 714/792; 375/265
(58) Field of Search ................................ 714/792, 786, 714/809, 810; 708/315, 420, 534, 813; 735/265, 237, 238

(56) References Cited

U.S. PATENT DOCUMENTS

| | | | |
|---|---|---|---|
| 5,233,629 A | * | 8/1993 | Paik et al. .................. 375/262 |
| 6,034,996 A | * | 3/2000 | Herzberg .................... 375/265 |
| 6,138,265 A | * | 10/2000 | Morelos-Zaragoza et al. ... 714/792 |
| 6,266,795 B1 | * | 7/2001 | Wei ............................ 714/755 |

OTHER PUBLICATIONS

Goldstein, Yuri, "Parallel Transmission to Increase Realizable Data Rate in DMT–based Systems," *PC–Tel, Inc., Nurenberg, Germany,* Aug. 2–6, 1999.

* cited by examiner

*Primary Examiner*—Christine T. Tu
(74) *Attorney, Agent, or Firm*—Pillsbury Winthrop LLP

(57) ABSTRACT

A method for combining trellis-coded modulation with one-bit constellations to make more efficient use of available channel capacity in discrete multitone (DMT) asymmetric digital subscriber line (ADSL) systems. Through fine transmit gain adjustment, in individual tones, DMT systems are able to compensate for truncation effects in bits-per-tone loading. However, the allowed fine gain adjustment range is insufficient to compensate for the DMT requirement that data modulated tones carry at least two bits. Therefore, by allowing data-modulated tones to carry a single bit, the available channel capacity can be more efficiently utilized. Additionally, one-bit constellations may be combined with trellis coded modulation. A pair of one-bit sub-carrier may be considered as a virtual two-bit sub-carrier in the trellis encoder with the resulting encoded bit pair transmitted on the original sub-carriers using one-bit constellations.

13 Claims, 3 Drawing Sheets

100

TRELLIS CODING WITH ONE-BIT CONSTELLATIONS

This application claims the benefit of Provisional Application No. 60/176,130, filed Jan. 14, 2000.

BACKGROUND OF THE INVENTION

The trellis coding scheme defined for discrete multitone (DMT) asymmetric digital subscriber line (ADSL) systems (ITU Standard G.992.1) requires that data modulated tones carry at least two bits. Although fine transmit gain adjustment can be used to compensate for integer truncation effects in bit loading, the allowable fine gain adjustment range is insufficient to compensate for bit loading truncation from 2-bits to 0-bits. As a result, trellis coded DMT systems are unable to take advantage of the capacity available in tones that have insufficient signal-to-noise ratio (SNR) to support 2-bits, after allowing for fine gain adjustment.

Parallel transmission of information on several DMT tones has been proposed as a means of utilizing the capacity in low SNR sub-carriers. ("Parallel Transmission to Increase Realizable Data Rate in DMT-based Systems," NG-039, Nuremberg, Germany, August 1999.) Parallel transmission of information would provide redundant capability to some degree because fractional bit loading of tones can be effectively realized through fine transmit gain adjustment. If one-bit constellations are combined with fine gain adjustment, sub-carriers that support at least ½ bit at nominal transmit power are available for data modulation.

BRIEF SUMMARY OF THE INVENTION

The present invention is directed to a method for combining trellis-coded modulation with one-bit constellations to make more efficient use of available channel capacity in discrete multitone (DMT) asymmetric digital subscriber line (ADSL) systems. Through fine transmit gain adjustment, in individual tones, DMT systems are able to compensate for truncation effects in bits-per-tone loading. However, the allowed fine gain adjustment range is insufficient to compensate for the DMT requirement that data modulated tones carry at least two bits. Therefore, by allowing data-modulated tones to carry a single bit, the available channel capacity can be more efficiently utilized.

Additionally, one-bit constellations may be combined with trellis coded modulation such that the primary design of the G.992.1 trellis encoder and decoder remain unchanged. A pair of one-bit modulated sub-carriers may be treated as a virtual two-bit modulated sub-carrier in the trellis encoder and decoder. At the transmitter, a trellis encoded bit pair is transmitted on two sub-carriers, using one-bit constellations, rather than a single sub-carrier using two-bit constellations. At the receiver, two one-bit sub-carriers are remodulated to form a single two-bit sub-carrier prior to trellis decoding. In this manner, the G.922.1 trellis encoder and decoder (issue 4.6.2), which typically require two-bit constellations for proper operation, may be made to operate properly with one-bit constellations.

Simulation results show imperceptible differences, in ADSL upstream and downstream data capacities, for pure fractional bit loading versus ½ bit-per-tone minimum loading. In addition, a simple technique is shown for extending trellis coded modulation to single-bit constellations.

DETAILED DESCRIPTION

Simulation Results for One-Bit Constellations

Figure 1:
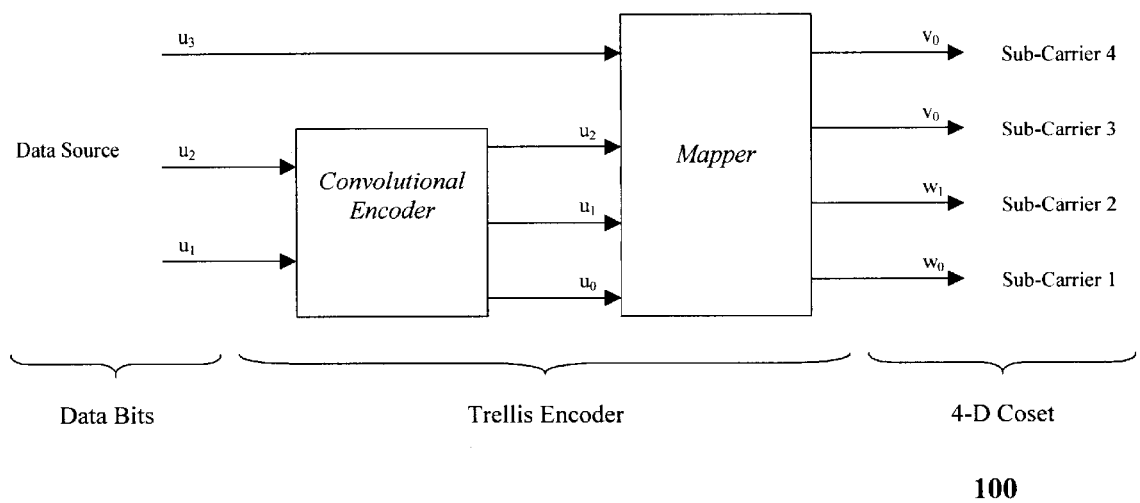
FIG. 1 illustrates the construction of sub-carrier pairs with one-bit constellations according to an embodiment of the present invention.

Table 1 and Table 2 below show simulated ADSL upstream and downstream data capacities, as a fraction of maximum data capacity, for DMT systems with sub-channel bit loading lower limits of 2-bits, 1-bit, and ½-bit. Maximum data capacity is based on pure fractional bit loading. Simulations were run for the test cases defined in G.992.2 for extended reach. For the test cases considered, there is no measurable difference between the capacity with pure fractional bit loading versus the capacity with ½ bit per symbol loading. These results indicate that there may not be a significant benefit to extending fractional bit loading beyond ½ bit (i.e., single-bit constellations combined with fine transmit gain adjustment).

TABLE 1

Simulated ADSL Upstream Data Capacity as a Fraction of Maximum Data Capacity

| | | Minimum Bits per Tone | | |
| --- | --- | --- | --- | --- |
| Test Loop | Impairment | 2 bit | 1 bit | ½ bit |
| T1.601 #1 | 3 FDM ADSL | .977 | .992 | 1.000 |
| T1.601 #2 | 24 FDM ADSL | .970 | .987 | 1.000 |
| T1.601 #5 | 49 FDM ADSL | .981 | .995 | 1.000 |
| T1.601 #5 | 25 DSL | .933 | 1.000 | 1.000 |
| T1.601 #9 | 49 FDM ADSL | .978 | 1.000 | 1.000 |
| T1.601 #9 | 24 DSL | .891 | 1.000 | 1.000 |
| T1.601 #7 | 24 HDSL | .701 | .865 | 1.000 |

TABLE 2

Simulated ADSL Downstream Capacity as a Fraction of Maximum Data Capacity

| | | Minimum Bits per Tone | | |
| --- | --- | --- | --- | --- |
| Test Loop | Impairment | 2 bit | 1 bit | ½ bit |
| T1.601 #1 | 3 FDM ADSL | .352 | .771 | 1.000 |
| T1.601 #2 | 24 FDM ADSL | .524 | .863 | 1.000 |
| T1.601 #5 | 49 FDM ADSL | .896 | .992 | 1.000 |
| T1.601 #5 | 25 DSL | .874 | .967 | 1.000 |
| T1.601 #9 | 49 FDM ADSL | .933 | 1.000 | 1.000 |
| T1.601 #9 | 24 DSL | 1.000 | 1.000 | 1.000 |
| T1.601 #7 | 24 HDSL | .658 | .874 | 1.000 |

Method of Extending Trellis Coded Modulation to One-Bit Constellations

The existing DMT trellis encoding procedure can be extended to the case of one-bit constellations. The trellis encoder takes three data bits and encodes them into two data bit pairs, $(v_1,v_0)$ and $(w_1,w_0)$, which define a Cartesian product of 2-dimensional cosets. In the case where two consecutive tones have a capacity for two bits (i.e., $x=2$, $y=2$), the data bit pair $(v_1,v_0)$ defines a two-bit constellation in one sub-carrier and the data bit pair $(w_1,w_0)$ defines a two-bit constellation in the second sub-carrier. Together, the data bit pairs $(v_1, v_0)$ and $(w_1,w_0)$ define a 4-dimensional coset, with one trellis overhead bit per 4-dimensional coset.

The extension of this process to single-bit constellations requires 4 sub-carriers, instead of two, to produce the same 4-dimensional coset. In the one-bit constellation case (i.e., x=1, y=1), $v_1$ defines a one-bit constellation in one sub-carrier, $v_0$ defines a one-bit constellation in a second sub-carrier, $w_1$ defines a one-bit constellation in a third sub-carrier, and $w_0$ defines a one-bit constellation in the fourth sub-carrier. Effectively, two sub-carriers are used to transmit the orthogonal components of a single two-bit constellation.

Therefore, utilizing the method above for combining trellis coded modulation with one-bit constellations, more efficient use of available channel capacity in DMT systems is realized. Through one-bit constellations and fine transmit gain adjustment in individual tones, DMT systems can utilize available channel capacity nearly as efficiently as DMT systems that support pure fractional bits per tone, via methods such as parallel transmission of information.

FIG. 1 illustrates the construction of sub-carrier pairs with one-bit constellations according to an embodiment of the present invention. The trellis coding used in G.992.1 is based on a 4-dimensional trellis code. A pair of two-dimensional sub-carriers (i.e., one sub-carrier with $x_1$ coordinate and $y_1$ coordinate, second sub-carrier with $x_2$ coordinate and $y_2$ coordinate) are encoded into a single 4-dimensional constellation point (i.e., with $x_1$ coordinate, $y_1$ coordinate, $X_2$ coordinate, and $y_2$ coordinate). Each sub-carrier has an x coordinate and y coordinate because the trellis code is requires at least 2-bits per sub-carrier. Proper trellis encoding and decoding therefore requires an even number of sub-carriers. In the case where only an odd number of sub-carriers is available, a two-dimensional sub-carrier is converted to a 4-dimensional sub-carrier by inserting a sub-carrier that carries no data.

The extension of trellis coding and decoding to include one-dimensional constellations (i.e., x coordinate only or y coordinate only) uses a modified mapping process. In this case, four one-dimensional sub-carriers 100 (i.e., one sub-carrier with $x_1$ coordinate, second sub-carrier with $y_1$ coordinate, third sub-carrier with $x_2$ coordinate, and fourth sub-carrier with $y_2$ coordinate) are encoded into a single 4-dimensional constellation point (i.e., with $x_1$ coordinate, $y_1$ coordinate, $x_2$ coordinate, and $y_2$ coordinate). Each sub-carrier requires only an x coordinate or a y coordinate because of the modified mapping process. Proper trellis encoding and decoding still requires an even number of sub-carriers. Therefore, one-dimensional sub-carriers pairs can be encoded while still using the trellis encoder and decoder of G.992.1.

Figure 2:
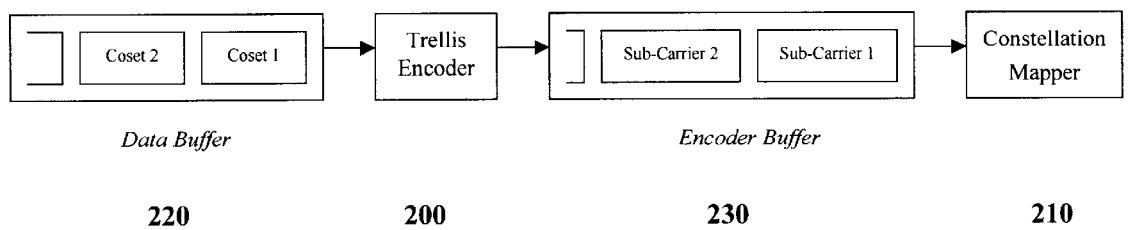
FIG. 2 illustrates the relationship of the trellis encoder with the constellation encoder according to an embodiment of the present invention.

FIG. 2 illustrates the relationship of the trellis encoder with the constellation encoder according to an embodiment of the present invention. After trellis encoding by the trellis encoder 200, the encoded bits are passed to the constellation encoder 210 to be mapped onto the sub-carriers. In the case of one-bit constellations, the trellis encoder 200 treats 4 one-bit sub-carriers as two virtual two-bit sub-carriers with capacity for two bits (i.e., x=2, y=2). As described above, the trellis encoder takes three data bits (i.e., x+y−1) from the data buffer 220 and passes four bits (i.e., x+y) the encoder buffer 230 where the bits are encoded into two data bit pairs (i.e., ($v_1,v_0$) and ($w_1,w_0$)) that define a Cartesian product of 2-dimensional cosets. The constellation encoder 210 maps $v_0$ onto the first one-bit sub-carrier, maps $v_1$ onto the second one-bit sub-carrier, maps $w_0$ onto the third one-bit sub-carrier, and maps $w_1$ onto the fourth one-bit sub-carrier.

Figure 3:
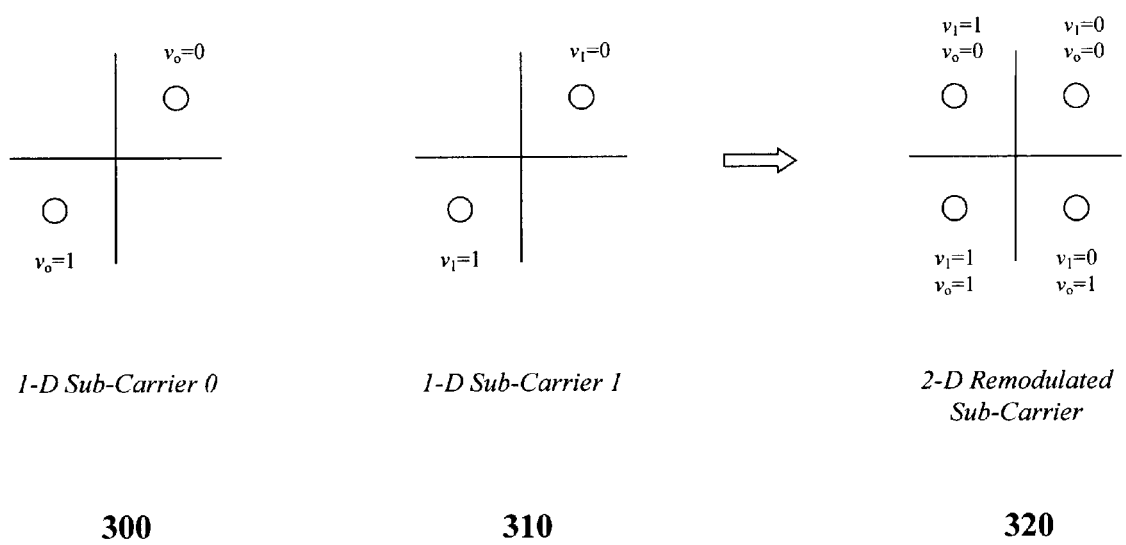
FIG. 3 illustrates the combination of two, one-bit constellations into a single, two-bit constellation according to an embodiment of the present invention.

FIG. 3 illustrates the combination of two, one-bit constellations into a single two-bit constellation according to an embodiment of the present invention. At the receiver side, a pair of one-bit constellations 300, 310 can be remodulated into a single two-bit constellation 320, as shown in FIG. 3. Using this combination method, trellis decoding can be performed using the trellis decoder of G.992.1.

While certain exemplary embodiments have been described in detail and shown in the accompanying drawings, it is to be understood that such embodiments are merely illustrative of and not restrictive on the broad invention, and that this invention is not to be limited to the specific arrangements and constructions shown and described, since various other modifications may occur to those with ordinary skill in the art.

What is claimed is:

1. A method of extending trellis coded modulation to one-bit constellations for a discrete multitone (DMT) system, comprising:

providing a number of one-bit loaded sub-carrier pairs;

trellis encoding each of the one-bit loaded sub-carrier pairs to produce encoded bits; and mapping the encoded bits onto one-bit loaded sub-carriers of the one-bit loaded sub-carrier pairs utilizing the one-bit constellations.

2. The method according to claim 1, further including performing tone ordering of the sub-carrier pairs prior to the trellis encoding.

3. The method according to claim 1, further including combining a pair of one-bit constellations to form a two-bit constellation.

4. A discrete multitone (DMT) system, comprising:

a trellis encoder to receive a number of one-bit loaded sub-carrier pairs and to encode each of the one-bit loaded sub-carrier pairs to produce encoded bits; and a constellation encoder to receive the encoded bits and to map the encoded bits onto one-bit loaded sub-carriers of the one-bit loaded sub-carrier pairs utilizing one-bit constellations.

5. The system according to claim 4, further including a data bits buffer to store data bits of the one-bit loaded sub-carrier pairs.

6. The system according to claim 4, further including an encoded bits buffer to store the encoded bits received from the trellis encoder and to provide the encoded bits to the constellation encoder.

7. The system according to claim 4, further including a tone ordering device to perform tone ordering of the sub-carrier pairs prior to providing the sub-carrier pairs to the trellis encoder.

8. The system according to claim 4, further including a receiver to receive and combine a pair of one-bit constellations into a two-bit constellation.

9. A discrete multitone (DMT) system, comprising:

a machine-readable medium; and machine-readable code, stored on the machine-readable medium, adapted to be loaded and executed on the system, the machine-readable code performing, receiving a number of one-bit loaded sub-carrier pairs, trellis encoding each of the one-bit loaded-sub carrier pairs to produce encoded bits, and mapping the encoded bits onto one-bit loaded sub-carriers of the one-bit loaded sub-carrier pairs utilizing one-bit constellations.

10. The system according to claim 9, further including a data bits buffer to store data bits of the one-bit loaded sub-carrier pairs.

11. The system according to claim 9, further including an encoded bits buffer to store the encoded bits and to provide the encoded bits to be mapped.

12. The system according to claim 9, further including a tone ordering device to perform tone ordering of the sub-carrier pairs.

13. The system according to claim 9, further including a receiver to receive and combine a pair of one-bit constellations into a two-bit constellation.

* * * * *